(12) United States Patent
Coffy et al.

(10) Patent No.: US 11,908,968 B2
(45) Date of Patent: Feb. 20, 2024

(54) OPTOELECTRONIC DEVICE

(71) Applicant: STMicroelectronics (Grenoble 2) SAS, Grenoble (FR)

(72) Inventors: Romain Coffy, Voiron (FR); Remi Brechignac, Grenoble (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 15 days.

(21) Appl. No.: 17/838,929

(22) Filed: Jun. 13, 2022

(65) Prior Publication Data

US 2022/0310869 A1    Sep. 29, 2022

Related U.S. Application Data

(62) Division of application No. 17/071,694, filed on Oct. 15, 2020, now Pat. No. 11,387,381.

(30) Foreign Application Priority Data

Oct. 31, 2019    (FR) ...................................... 1912261

(51) Int. Cl.
*H01L 31/16*        (2006.01)
*H01L 23/00*        (2006.01)
(52) U.S. Cl.
CPC .............. *H01L 31/16* (2013.01); *H01L 24/73* (2013.01); *H01L 2224/73265* (2013.01)
(58) Field of Classification Search
CPC ........................................................ H01L 31/16
See application file for complete search history.

(56) References Cited

U.S. PATENT DOCUMENTS

| 2011/0298004 | A1  | 12/2011 | Matsuda et al. |
| 2014/0021491 | A1  | 1/2014  | Meng et al. |
| 2017/0038459 | A1* | 2/2017  | Kubacki ................. G01S 7/497 |
| 2019/0187254 | A1* | 6/2019  | Kappel ................. G01S 7/4808 |
| 2020/0333442 | A1* | 10/2020 | Etschmaier ........... H01L 31/173 |
| 2021/0165085 | A1* | 6/2021  | Downing ................ G01S 17/08 |
| 2021/0373132 | A1* | 12/2021 | Etschmaier ....... H01L 31/02164 |

FOREIGN PATENT DOCUMENTS

| CN | 105977248  | B  | 3/2019 |
| EP | 2363726    | A1 | 9/2011 |
| EP | 3471152    | A1 | 4/2019 |
| JP | H05175545  | A  | 7/1993 |
| TW | 201725747  | A  | 7/2017 |
| WO | 2017142487 | A1 | 8/2017 |

OTHER PUBLICATIONS

INPI Search Report and Written Opinion for priority application, FR 1912261, report dated Jun. 26, 2020 (10 pages).

* cited by examiner

*Primary Examiner* — Yu-Hsi D Sun
(74) *Attorney, Agent, or Firm* — Crowe & Dunlevy

(57) ABSTRACT

An optoelectronic device includes an emitter of light rays and a receiver of light rays. The emitter is encapsulated in a transparent block. An opaque conductive layer is applied to a top surface and a side surface of the transparent block. The receiver is mounted to the opaque conductive layer at the top surface. An electrical connection is made between the receiver and the opaque conductive layer. A conductive strip is also mounted to the side surface of the transparent block and isolated from the opaque conductive layer. A further electrical connection is made between the receiver and the conductive strip.

15 Claims, 4 Drawing Sheets

OPTOELECTRONIC DEVICE

CROSS-REFERENCE TO RELATED APPLICATIONS

This application is a divisional of U.S. patent application Ser. No. 17/071,694, filed Oct. 15, 2020, which claims the priority benefit of French Application for Patent No. 1912261, filed on Oct. 31, 2019, the contents of which are hereby incorporated by reference in their entireties to the maximum extent allowable by law.

TECHNICAL FIELD

The present disclosure relates generally to optoelectronic devices and, more particularly, to devices comprising an emitter and a receiver of light rays.

BACKGROUND

Many electronic devices comprise a light ray emitter and a receiver configured to receive the rays emitted by the emitter. These, for example, are time-of-flight (TOF) sensors or optical switches.

A time-of-flight sensor enables to measure a distance between the sensor and an element of a scene. For this purpose, the time-of-flight sensor illuminates the scene with a light ray, and calculates the time taken by the ray to travel between the element and the sensor. The time of flight of this ray is directly proportional to the distance between the sensor and the object of the scene having its distance to the sensor measured.

An optical switch for example switches from one state to another when the distance between the switch and an object of the scene is shorter than a certain distance.

There is a need in the art to address all or some of the drawbacks of known optoelectronic devices.

SUMMARY

One embodiment provides an optoelectronic device comprising an emitter and a receiver of light rays, the receiver being located on a layer opaque to the wavelengths of the rays capable of being emitted by the emitter, the opaque layer extending above the emitter.

According to an embodiment, the receiver faces a portion of the emitter which does not emit the light rays.

According to an embodiment, the opaque layer is made of a conductive material electrically coupling the receiver to a node of application of a voltage.

According to an embodiment, the emitter is covered with a first block of a material at least partially transparent to the wavelengths of the light rays capable of being emitted by the emitter.

According to an embodiment, the opaque layer at least partially covers the first block.

According to an embodiment, a strip made of an electrically-conductive material opaque to the wavelengths of the rays capable of being emitted by the emitter at least partially extends over the first block, the receiver being electrically coupled to the strip.

According to an embodiment, the opaque layer totally covers the first block except for a region separating the opaque layer and the strip and except for the region facing the portion of the emitter intended to emit the light rays.

According to an embodiment, a second block of a material at least partially transparent to the wavelengths of the light rays capable of being emitted by the emitter extends from the first block facing the portion of the emitter intended to emit the light rays, the lateral walls of the second block being covered with the opaque layer.

According to an embodiment, at least one filter is located opposite the portion of the emitter intended to emit the light rays and the portion of the receiver intended to receive the light rays.

Another embodiment provides a method of manufacturing an optoelectronic device comprising a receiver and an emitter of light rays, the method comprising forming a layer opaque to the wavelengths of the rays capable of being emitted by the emitter, the opaque layer extending above the emitter, the receiver being located on the opaque layer.

According to an embodiment, the method comprises forming a first block of a material at least partially transparent to the wavelengths of the light rays capable of being emitted by the emitter, the first block covering the emitter.

According to an embodiment, the method comprises forming a strip of an electrically-conductive material opaque to the wavelengths of the rays capable of being emitted by the emitter at least partially extending on the first block, the receiver being electrically coupled to the strip.

According to an embodiment, the opaque layer is formed to totally cover the first block except for a region separating the opaque layer and the strip and except for the region facing the portion of the emitter intended to emit the light rays.

According to an embodiment, the method comprises forming a second block of a material at least partially transparent to the wavelengths of the light rays capable of being emitted by the emitter extending from the first block facing the portion of the emitter intended to emit the light rays, the lateral walls of the second block being covered with the opaque layer.

According to an embodiment, the first and second blocks are formed by a resin molding.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
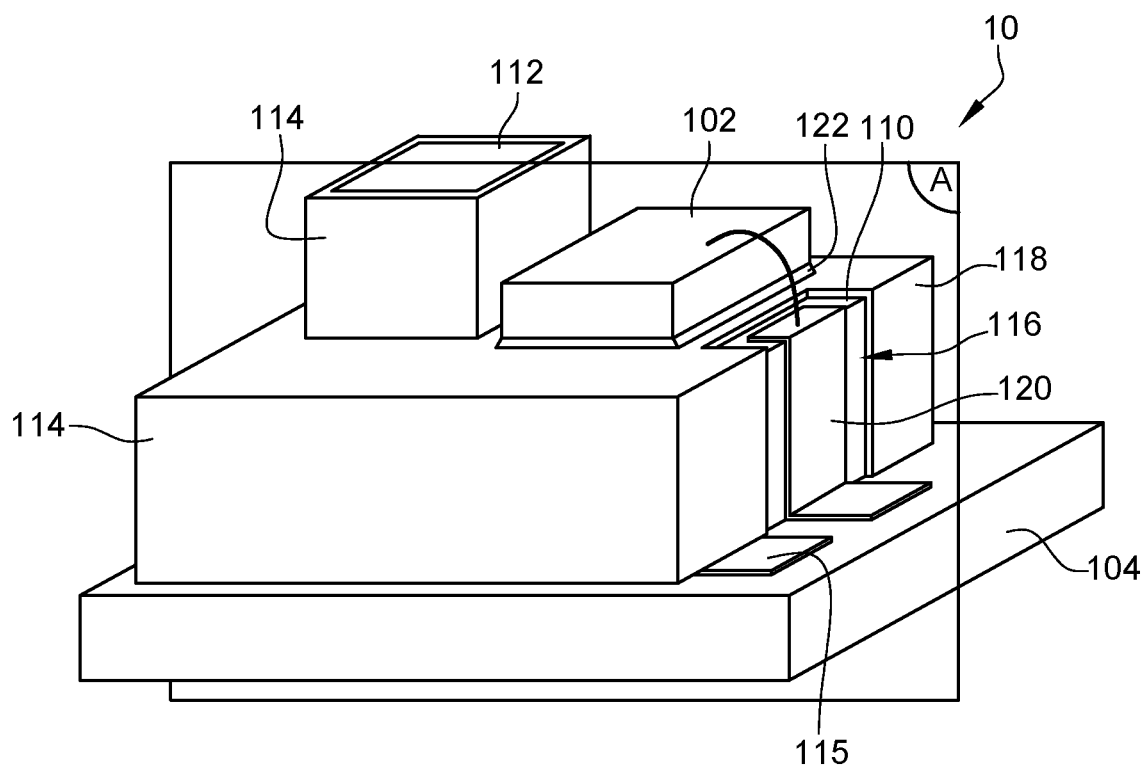
FIG. 1 is a three-dimensional view of a portion of an embodiment of an optoelectronic device.
Figure 2:
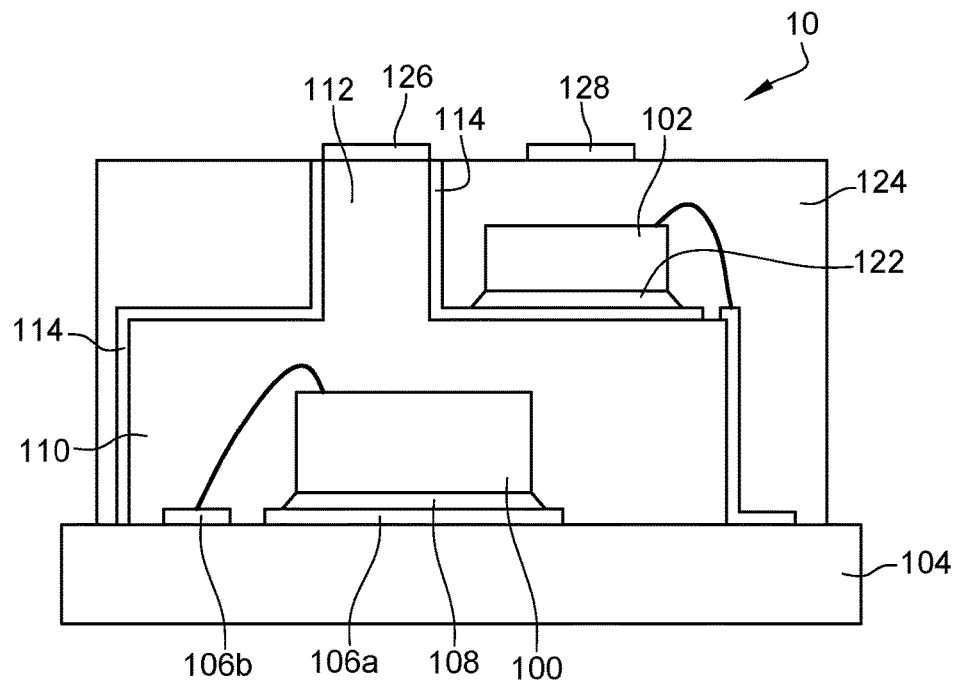
FIG. 2 is a cross-section view of the embodiment of FIG. 1.

FIGS. 1 and 2 show an embodiment of an optoelectronic device 10. FIG. 1 is a three-dimensional view of a portion of device 10. FIG. 2 is a cross-section view of device 10 along cross-section plane A.

Device 10 is, for example, a time-of-flight sensor or an optical switch. Device 10 comprises an emitter 100 (FIG. 2) of light rays and a receiver 102 of light rays. The rays emitted by emitter 100 are, for example, infrared rays (having, for example, a wavelength greater than 700 nm). Receiver 102 is configured to receive at least part of the rays emitted by emitter 100. For example, receiver 102 is configured to receive light rays emitted by emitter 100 and reflected on an element of a scene located opposite device 10.

For example, receiver 102 and emitter 100 comprise a circuit, not shown, or are coupled to a circuit, not shown, configured to determine the distance of an element of a scene based the time between the emission of the rays by emitter 100 and their reception by receiver 102.

Device 10 comprises a support 104. Emitter 100 is located on and bonded to support 104. Support 104 is, for example, at least partially made of an electrically-insulating material.

In the embodiment of FIGS. 1 and 2, conductive pads 106 (not shown in FIG. 1), for example, metal pads, are located on the upper surface of support 104. Pads 106 are, for example, coupled together and/or to other electronic components (not shown) via connection means, not shown. The connection means are, for example, conductive vias and metallization levels located in support 104. The connection means are, for example, conductive tracks located on the upper surface of support 104.

Emitter 100 is located on a conductive pad 106, designated in FIG. 2 with reference 106a. For example, emitter 100 is bonded to pad 106a by a bonding layer 108, for example, a glue layer. Preferably, bonding layer 108 is a conductive layer.

Emitter 100 is, for example, coupled to one or a plurality of other conductive pads 106b, for example, by a wire connection, for example, by electric bonding wires. FIG. 2 shows a single pad 106a and a single pad 106b.

Emitter 100 is, for example, coupled to a first node of application of a potential via pad 106a. Emitter 100 is, for example, coupled to a second node of application of a potential via pad 106b.

Device 10 comprises a block 110 covering emitter 100. Block 110 forms a protection case around emitter 100. Block 110 is made of a material at least partially transparent to the wavelengths of the rays capable of being emitted by emitter 100. Block 110 is preferably made of an electrically-insulating material. For example, block 110 is made of resin. The term material transparent to a wavelength designates a material giving way to at least 90% of the rays having this wavelength.

Block 110 covers (for example, encapsulates) emitter 100, conductive pad 106a, and pad(s) 106b. Block 110, for example, has a parallelepipedal shape. Block 110, for example, comprises a substantially planar upper surface. The upper surface is, for example, substantially horizontal. The planar upper surface is, for example, substantially parallel to the upper surface of support 104. Block 110 further comprises lateral surfaces extending from the planar upper surface to the support 104. The lateral surfaces are, for example, substantially vertical. The lateral surfaces are, for example, substantially perpendicular to the planar upper surface as well as the upper surface of support 104.

Device 10 further comprises another block 112. Block 112 is made of a material at least partially transparent to the wavelengths of the rays capable of being emitted by emitter 100. Block 112 is preferably made of an electrically-insulating material. For example, block 112 is made of resin. Block 112 is preferably made of the same material as block 110.

Block 112 rests on the upper surface of block 110. Block 112 is in contact with the upper surface of block 110. Block 112 faces emitter 100. More precisely, block 112 faces the portion of emitter 100 emitting the light rays. Block 112 is located in such a way that the rays emitted by emitter 100 cross block 110 and then cross block 112 before being emitted from the device 10 and reaching (i.e., illuminating) the scene.

Block 112 preferably has a parallelepipedal shape. The dimensions of block 112 at the level of the contact with block 110 are preferably at least equal to the dimensions of the portion of emitter 100 emitting the light rays. The block 112, for example, comprises a substantially planar upper surface. The upper surface is, for example, substantially horizontal. The planar upper surface is, for example, substantially parallel to the upper surface of block 110. Block 112 further comprises lateral surfaces extending from the planar upper surface to the block 110. The lateral surfaces are, for example, substantially vertical. The lateral surfaces are, for example, substantially perpendicular to the planar upper surface as well as the upper surface of block 110.

Block 112 partially covers block 110. The upper surface of block 110 thus comprises regions which are not covered by block 112. In particular, block 110 comprises a region, not covered by block 112, which is sufficiently large to accommodate the receiver 102.

Device 10 comprises a layer 114 at least partially covering block 110 and block 112. Layer 114 preferably totally covers the lateral surfaces of block 112. More precisely, layer 114 totally covers the surfaces of block 112 other than the lower surface, that is, the surface in contact with block 110, and the upper surface of block 112. In other words, layer 114 totally covers the surfaces of block 112 other than the surfaces crossed by the rays reaching the scene. Layer 114 at least partially covers the upper surface and the lateral surfaces of block 110.

Layer 114, for example, comprises a portion 115 extending on support 104. Portion 115 is, for example, coupled, like conductive pads 106, to conductive pads and/or to other electronic components, via connections means, for example, conductive vias and metallization levels located in support 104 or conductive tracks located on the upper surface of support 104.

As a variation, layer 114 does not comprise portion 115 and is directly coupled to the connection means by the portions of layer 114 covering the lateral walls of block 110.

Layer 114 is made of a conductive material, for example, of a metal. Layer 114 is made of a material opaque to the wavelengths of the rays capable of being emitted by the emitter. Layer 114 is, for example, made of copper. For example, layer 114 is preferably covered with an additional layer, not shown, made of an alloy comprising nickel and gold. The additional layer which is not shown provides a better bonding to regions 110, 112. Further, the additional layer which is not shown enables to avoid the oxidation of the copper. The thickness of layer 114 is, for example, in the range from approximately 10 nm to approximately 15 nm. The term material opaque to a wavelength designates a material passing less than 0.001% of the rays having this wavelength.

Preferably, layer 114 comprises an opening 116 (shown in FIG. 1, but not shown in FIG. 2). Opening 116 extends, in the example of FIGS. 1 and 2, along the entire height of a lateral surface 118 of block 110. However, opening 116 preferably does not extend over the entire surface 118. Opening 116 preferably partially extends over the upper surface of block 110.

A strip 120 extends on block 110, in opening 118. Strip 120 preferably extends from the upper surface of block 110 to the upper surface of support 104. More precisely, strip 120 partially extends on the upper surface of block 110, and along the entire height of block 110. Preferably, strip 120 partially extends on the upper surface of support 104.

Strip 120 is made of a conductive material, for example, a metal. Strip 120 is made of a material opaque to the wavelengths of the rays capable of being emitted by emitter 100. Preferably, strip 120 is made of the same material as layer 114.

Strip 120 is not in contact with layer 114. Strip 120 is not electrically connected to layer 114. Strip 120 is, for example, coupled, like conductive pads 106, to conductive pads and/or to other electronic components, for example, by means of the conductive vias and of the metallization levels located in support 104 or by means of the conductive tracks located on the upper surface of support 104.

As a variation, a cavity (not shown) may be located in block 110 at the level of opening 116, at the location of strip 120. The depth of opening 116 is preferably smaller than or equal, preferably equal, to the thickness of strip 120. Strip 120 is then located in the cavity.

Block 110 is thus entirely covered with a material (layer 114 and strip 120) opaque to the wavelengths of the rays capable of being emitted by emitter 100, except for the region in contact with block 112 and for a trench separating and electrically insulating strip 120 from layer 114.

Receiver 102 is located above block 110. Receiver 102 is thus located between the emitter and the scene. Receiver 102 is separated from the upper surface of block 110, and thus of emitter 100, by layer 114. Receiver 102 is thus located on layer 114 covering the upper surface of block 110. Receiver 102 is preferably bonded to layer 114 by a bonding layer 122, for example, a glue layer. Bonding layer 122 is preferably made of a conductive material.

Receiver 102 is offset with respect to the portion of emitter 100 emitting the rays, to avoid blocking the emission of rays crossing block 112. Receiver 102 thus preferably faces a portion of emitter 100 which does not emit the light rays.

Receiver 102 is preferably located close to strip 120. Receiver 102 is preferably located between block 112 and strip 120. Preferably, receiver 102 is sufficiently close to strip 120 to be coupled to strip 120 by an electric wire.

Receiver 102 is, for example, coupled, on the one hand, to layer 114 and, on the other hand, to strip 120. For example, layer 114 is coupled to a node of application of a reference voltage, for example, the ground. Receiver 102 is thus, for example, coupled to this node of application of a reference voltage via bonding layer 122 and layer 114. For example, strip 120 is coupled to a node of application of another voltage. Receiver 102 is, for example, coupled to a node of application of the other voltage via electric wire and strip 120. Similarly, emitter 100 is, for example, coupled to nodes of application of voltages via connection pads 106.

Device 10 further comprises a block 124 covering (i.e., encapsulating) layer 114, receiver 102, layer 122, and a portion of support 104. Block 124 forms a protection case around receiver 102 and blocks 100 and 112. Block 124 is made of a material at least partially transparent to the wavelengths of the rays capable of being emitted by emitter 100. Block 124 is preferably made of an electrically-insulating material. For example, block 124 is made of resin. Block 112 is preferably made of the same material as blocks 110 and 112.

Block 124, for example, has a parallelepipedal shape. The upper surface of block 124 is, for example, coplanar with the upper surface of block 112. Block 124, for example, surrounds block 112 and leaves the upper surface of block 112 exposed. As a variation, block 124 may at least partially cover the upper surface of block 112.

Filters 126 and 128 are respectively formed opposite emitter 100 and receiver 102. Preferably, filters 126 and 128 are made of a material having transmittance values that art: smaller than approximately 10% for wavelengths shorter than approximately 650 nm, preferably for wavelengths shorter than 750 nm; and greater than approximately 90% for wavelengths greater than 900 nm, preferably for wavelengths greater than 850 nm.

Filter 126, for example, has dimensions substantially equal to or greater than the dimensions of the region of emitter 100 emitting the light rays. In particular, filter 126 preferably covers at least the entire surface of block 112. Similarly, filter 128, for example, has horizontal dimensions substantially equal to or greater than the dimensions of the portion of receiver 102 receiving the rays.

For clarity, block 124 and filters 126 and 128 are not shown in FIG. 1. Similarly, emitter 100, bonding layer 108, and conductive pads 106, located under layer 114, are not shown in FIG. 1.

As a variation, opening 116 may extend over a smaller region, for example, may not extend over the upper surface of block 110. The electric wire extending from the receiver to strip 120 is then longer.

As a variation, layer 114 entirely covers block 110 except for the portions in contact with block 112 or support 104. Emitter 100 is, for example, coupled by the electric wire to a conductive pad, for example, located on the support.

The path of the light rays emitted by emitter 100 is, for example, comprised of the crossing of the portion of block 110 facing emitter 100, the crossing of block 112, the crossing of filter 126, the travel from device 10 to an element in the scene, the reflection on the element in the scene, the travel from the element to device 10, the crossing of filter 128, and the crossing of the portion of block 124 facing receiver 102. The presence of layer 114 around blocks 110 and 112, and in particular between the path of the rays in blocks 110 and 112 and receiver 102, enables to ensure that receiver 102 receives no rays directly from the emitter, that is, receives no rays emitted by emitter 100 which have not been reflected on an element in the scene.

FIGS. 3 to 6 show steps, preferably successive, of an embodiment of a method of manufacturing the device of FIGS. 1 and 2. FIGS. 3 to 6 describe the manufacturing of a single device 10. In practice, devices 10 are manufactured in wafers, that is, a plurality of devices 10 is simultaneously manufactured on a same wafer. The plurality of devices 10, for example, forms an array of devices. Devices 10 are, for example, separated from one another by a distance greater than or equal to approximately 250 µm. The steps described in relation with FIGS. 3 to 6 are simultaneously carried out in a plurality of locations in the wafer.

Figure 3:
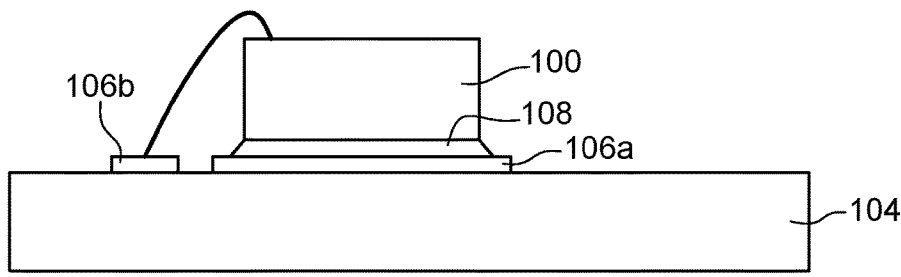
FIG. 3 shows a step of manufacturing the embodiment of FIG. 1.

FIG. 3 shows a step of manufacturing the embodiment of FIG. 1. During this step, conductive pads 106 are formed on support 104. Similarly, the means for coupling the conductive pads, that is, vias and metallizations located in the support or conductive tracks located on support 104, are formed.

Emitter 100, having been previously manufactured, is then bonded to pad 106. For example, emitter 100 is bonded to pad 106a by bonding layer 108 deposited on pad 106.

Connections may also be formed between emitter 100 and pads 106b. The connections are, for example, formed as previously described, for example, by electric (bonding) wires coupling emitter 100 and pads 106b.

Figure 4:
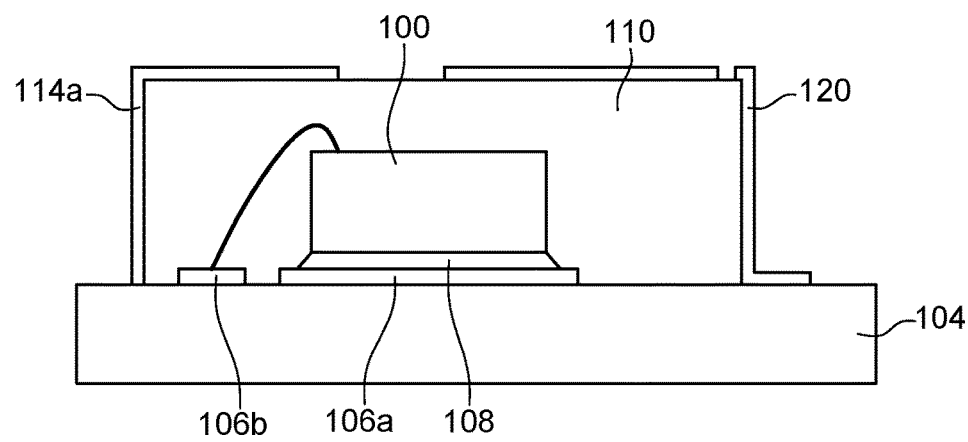
FIG. 4 shows another step of manufacturing the embodiment of FIG. 1.

FIG. 4 shows another step of manufacturing the embodiment of FIG. 1. During this step, block 110 is formed on emitter 100. Preferably, block 110 covers conductive pads 106. For example, block 110 is formed by resin molding to encapsulate the emitter 100 and pads 106.

This step further comprises the forming of a portion 114a of layer 114, including, if need be, the forming of portion 115. This step further comprises the forming of strip 120.

According to an embodiment, a layer made of the material of layer 114 and of strip 120 is formed over the entire block 110 except for the location of opening 116 and the location of block 112. Such locations are, for example, covered with a mask during the forming of portion 114a and of strip 120.

According to an embodiment, this step comprises the forming of the cavity (not shown) in block 110 at the location of strip 120. Portion 114a and strip 120 are preferably formed after the forming of the cavity.

Figure 5:
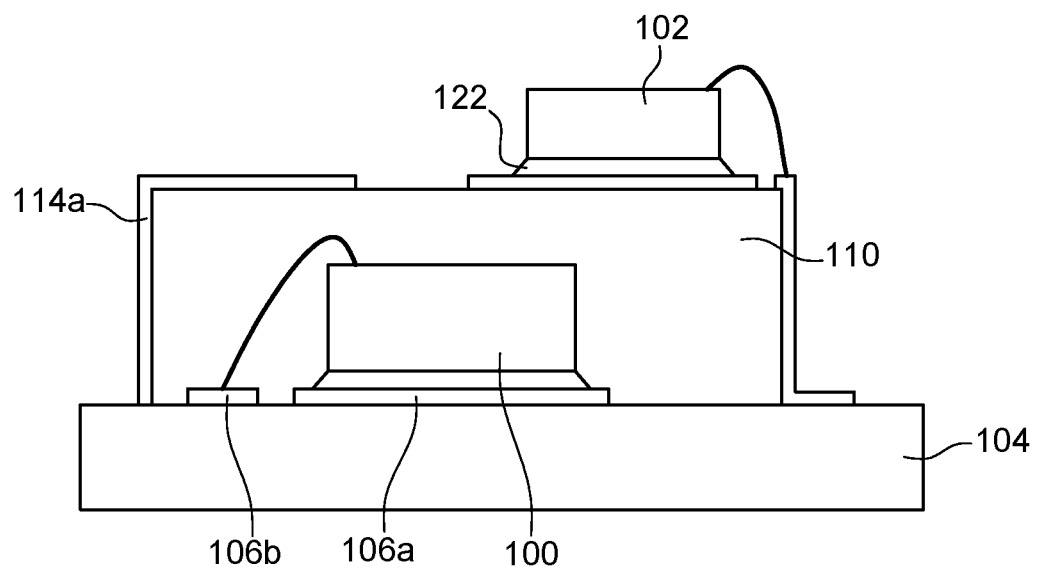
FIG. 5 shows still another step of manufacturing the embodiment of FIG. 1.

FIG. 5 shows still another step of manufacturing the embodiment of FIG. 1.

During this step, receiver 102, having preferably being previously formed, is bonded to portion 114a. More precisely, receiver 102 is bonded to a region of portion 114a located on the upper surface of block 110.

The step of bonding the receiver, for example, includes the forming of bonding layer 122 on portion 114a and the deposition of receiver 102 on layer 122. Receiver 102 is thus electrically coupled to portion 114a, for example, by bonding layer 122.

During this step, an electric connection is formed between receiver 102 and strip 120. For example, an electric (bonding) wire is formed between receiver 102 and strip 120.

Figure 6:
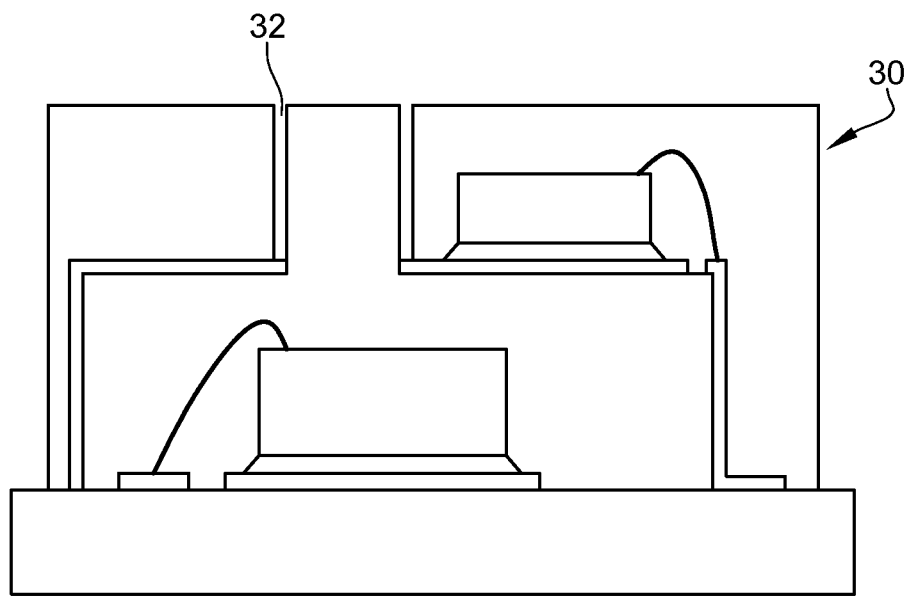
FIG. 6 shows still another step of manufacturing the embodiment of FIG. 1.

FIG. 6 shows still another step of the manufacturing of the embodiment of FIG. 1. During this step, block 112 and block 124 are formed.

According to an embodiment, a layer 30 made of the material of blocks 112 and 124 is formed on the structure resulting from the previous step. Layer 30 is then etched to form block 124 and block 112. In particular, layer 30 is, for example, etched to be planarized at the level of the upper surface of block 124. Layer 30 is further etched to separate block 124 from the blocks 124 of other devices 10 on the same wafer. A trench 32 is further etched at the location of the portions of layer 114 surrounding block 112. The trench thus extends from the upper surface of layer 30 and all the way to portion 114a. Trench 32 thus surrounds block 112.

As a variation, blocks 112 and 124 may be formed separately, for example, by using resin shaping molds.

The method of manufacturing the embodiment of FIG. 1 comprises steps, not shown. In particular, during subsequent steps, trench 32 is filled with a material opaque to the wavelengths of the light rays capable of being emitted by emitter 102. Preferably, the material is the same material as the material of portion 114a of the already-formed layer 114.

The method further comprises the forming of filters 126 and 128.

A mask is, for example, formed on the upper surfaces of blocks 112 and 124, to cover the locations which are not covered by filters 126 and 128. Filters 126 and 128 are then formed at the locations which are not covered by the mask.

As a variation, a layer made of the material of filter 126 and 128 is, for example, formed to totally cover blocks 112 and 124 and the exposed portions of layer 114. The layer made of the material of filters 126 and 128 is then etched to form filters 126 and 128.

The method further comprises a step during which the different devices 10 of a same wafer are individualized, that is, for example, support 104 is sawn between the different devices 10.

Figure 7:
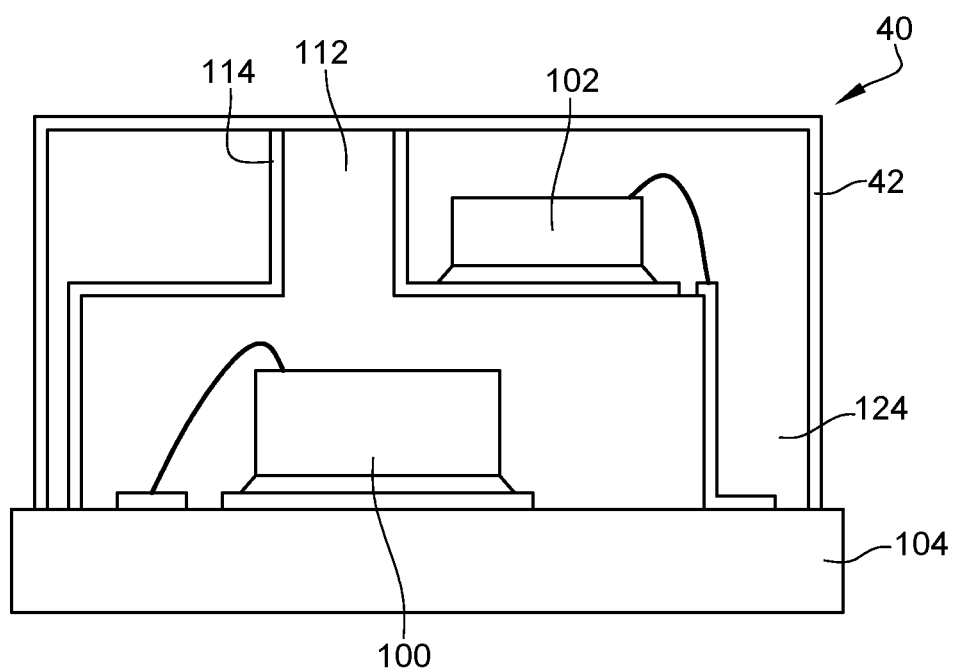
FIG. 7 is a cross-section view of another embodiment of an optoelectronic device.

FIG. 7 is a cross-section view of another embodiment of an optoelectronic device 40.

Device 40 is identical to device 10 except for filters 126 and 128, which are replaced with a layer 42 made of the material of filters 126 and 128. Receiver 102 and emitter 100 face a same filter.

In the example of FIG. 7, layer 42 entirely covers block 124 as well as the upper surface of block 112 and the exposed portions of layer 114. More precisely, layer 42 covers, in this embodiment, the lateral surfaces of block 124, the upper surface of block 124, the upper surface of block 112, and the exposed portions of layer 114.

As a variation, layer 42 may not cover the lateral surfaces of block 124.

As a variation, layer 42 may partially cover the upper surface of block 124. Preferably, layer 42 covers at least the regions opposite the portions of emitter 100 and receiver 102 emitting and receiving the light rays.

An advantage of the described embodiments is that each device uses a surface area smaller than the surface area used by a similar device having its emitter 100 and its receiver 102 both formed on support 104.

Another advantage of the described embodiments is that the opaque material separates the emitter and the receiver, thus avoiding for rays to reach the receiver without having been reflected on the scene, which would disturb the measurement.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing an optoelectronic device, comprising:
   encapsulating an emitter of light rays in a first transparent block;
   forming a layer at least partially covering an upper surface and a side surface of the first transparent block, said layer being opaque to wavelengths of light rays emitted by the emitter;
   mounting a receiver of light rays to said layer at the upper surface of the first transparent block.

2. The method according to claim 1, wherein the layer is electrically conductive, and further comprising electrically connecting the receiver to said electrically conductive layer.

3. The method according to claim 1, further comprising:
   forming a strip made of an electrically conductive material extending on the side surface of the first transparent block; and
   electrically connecting the receiver to said strip.

4. The method according to claim 3, wherein the strip is opaque to the wavelengths of the light rays emitted by the emitter.

5. The method according to claim 4, wherein the layer totally covers the first transparent block except for: a location of the strip; a region separating the layer and the strip; and a region facing a portion of the emitter that emits the light rays.

6. The method according to claim 1, wherein the layer does not cover a portion of the upper surface of the first transparent block at a location facing a portion of the emitter that emits the light rays.

7. The method according to claim 6, further comprising forming a second transparent block extending from the upper surface of the first transparent block at said location facing the portion of the emitter that emits the light rays.

8. The method according to claim 7, further comprising covering lateral walls of the second transparent block with an opaque layer.

9. The method according to claim 7, wherein the first and second transparent blocks are formed by a resin molding.

10. The method according to claim 1, further comprising:
    encapsulating the first transparent block in a second transparent block;
    etching through the second transparent block to divide the second transparent block into a first block portion extending from the upper surface of the first transparent block at a location facing the portion of the emitter that emits the light rays and a second block portion which surrounds the first block portion and encapsulates the receiver.

11. The method according to claim 10, further comprising filling an opening between the first and second block portions with a material that is opaque to wavelengths of light rays emitted by the emitter.

12. The method according to claim 10, further comprising:
    forming a first filter at an upper surface of the first block portion extending over the emitter; and
    forming a second filter at an upper surface of the second block portion extending over the receiver.

13. The method according to claim 1, further comprising mounting the emitter to a support having a top surface including a first electrical pad, a second electrical pad and a third electrical pad.

14. The method according to claim 13, further comprising:
    electrically connecting the emitter to the first electrical pad, wherein the first transparent block encapsulates the emitter and the first electrical pad; and
    electrically connecting the layer to the second electrical pad, wherein the receiver is electrically connected to the layer.

15. The method according to claim 14, further comprising:
    forming a strip made of an electrically conductive material extending on the side surface of the first transparent block;
    electrically connecting the receiver to said strip; and
    electrically connecting the strip to the third electrical pad.

* * * * *